United States Patent

McDaniels et al.

[11] Patent Number: 5,411,405
[45] Date of Patent: May 2, 1995

[54] MINIATURE ELECTRICAL COMMUNICATIONS CONNECTORS

[75] Inventors: Steve R. McDaniels; Paul H. Glad; David Naegle; Jon R. Hinto, all of Salt Lake City, Utah

[73] Assignee: Angia Communications, Inc., Provo, Utah

[21] Appl. No.: 151,249

[22] Filed: Nov. 12, 1993

[51] Int. Cl.$^6$ .................................... H01R 13/50
[52] U.S. Cl. ................... 439/131; 439/676; 439/586
[58] Field of Search ............ 439/135, 136, 131, 676, 439/638, 586, 144

[56] References Cited

U.S. PATENT DOCUMENTS

| | | |
|---|---|---|
| 1,989,823 | 2/1935 | Raabe . |
| 3,433,886 | 3/1969 | Myers . |
| 3,553,635 | 7/1970 | Lundergan et al. . |
| 3,613,043 | 10/1971 | Richard . |
| 3,622,684 | 11/1971 | Press . |
| 3,685,002 | 8/1972 | Kennedy . |
| 3,777,303 | 12/1973 | McDonough . |
| 3,794,956 | 2/1974 | Dubreuil . |
| 4,047,781 | 9/1977 | DeNigris et al. . |
| 4,059,321 | 11/1977 | Rasmussen et al. . |
| 4,109,295 | 8/1978 | Rostek et al. . |
| 4,482,938 | 11/1984 | Nordan . |
| 4,497,526 | 2/1985 | Myers . |
| 4,511,198 | 4/1985 | Mitchell et al. . |
| 4,603,229 | 7/1986 | Menchetti ............... 439/135 X |
| 4,648,682 | 3/1987 | Tubbs ..................... 439/638 X |
| 4,758,168 | 7/1986 | Awakowicz et al. . |
| 4,809,360 | 2/1989 | Kraft . |
| 4,878,848 | 11/1989 | Ingalsbe .................. 439/676 X |

(List continued on next page.)

FOREIGN PATENT DOCUMENTS

| | | |
|---|---|---|
| 2101354 | 1/1994 | Canada . |
| 2103514 | 2/1994 | Canada . |
| 355413 | 7/1989 | European Pat. Off. . |
| 1195385 | 6/1965 | Germany . |
| 62-29344 | 2/1987 | Japan . |
| 62-78656 | 4/1987 | Japan . |

(List continued on next page.)

OTHER PUBLICATIONS

"Unique Features for SRAM Card".
"616L-Type Telephone Jacks" by Molex.
"623K Telephone Jacks" by Molex.
"Worldport Fax/Data PCMCIA 2.0 Modem" by US Robotics.
"PCMCIA Redefines Mobile Computing" by Earle J. Robinson, Jul. 1993.
"Phone Jacks" by Mouser Electronics.
"Modular Jacks" by Pan Pacific Enterprise Co., Inc.
"Fujitsu IC Memory Card Connector, User's Manual", by Fujitsu.
"Computer Reseller/VAR Catalog" by Belkin Components.
"Flash Memory Card" by Centennial.
"The Wizard electronic organizer" by Sharp.
"IC Memory Card" by Panasonic.

Primary Examiner—David L. Pirlot
Assistant Examiner—Daniel Wittels
Attorney, Agent, or Firm—Thorpe, North & Western

[57] ABSTRACT

An apparatus for receiving an RJ series plug and making electrical connection with at the contacts on the plug and conveying any signals on the contacts to a communications device such as a telephone, facsimile machine, modem, or a local area network adapter. A body includes one or more recesses which receive the plug. An expandable and stretchable membrane isolates the contacts in the plug from electrical contact with an object in a surrounding environment such that passage of current from one or more of the electrical contacts to an object present in the surrounding environment is prevented. A removable shell is provided into which the body is slidably held within the communications device. The removable shell allows the shell and the body to be easily replaced. Another body can be pivotally attached to the communications device such that the body is rotated into and out of the communications device for storage and use.

19 Claims, 6 Drawing Sheets

U.S. PATENT DOCUMENTS

| | | |
|---|---|---|
| 4,954,928 | 9/1990 | Jullien . |
| 4,968,260 | 11/1990 | Ingalsbe .......................... 439/676 X |
| 4,969,830 | 11/1990 | Daly et al. . |
| 4,984,982 | 1/1991 | Brownlie et al. . |
| 4,986,762 | 1/1991 | Keith . |
| 4,993,962 | 2/1991 | Noda et al. . |
| 4,997,381 | 3/1991 | Oh . |
| 5,035,641 | 7/1991 | Van-Sanbrink et al. . |
| 5,035,649 | 7/1991 | Collier et al. . |
| 5,043,721 | 8/1991 | May . |
| 5,082,450 | 1/1992 | Warren, Sr. et al. . |
| 5,085,591 | 2/1992 | Warren, Sr. et al. . |
| 5,114,356 | 5/1992 | Taybl et al. . |
| 5,122,069 | 6/1992 | Brownlie et al. . |
| 5,132,877 | 7/1992 | Branan et al. . |
| 5,159,533 | 10/1992 | Kuang . |
| 5,182,698 | 1/1993 | Kobyashi et al. . |
| 5,183,404 | 2/1993 | Aldous et al. . |
| 5,260,994 | 11/1993 | Suffi ................................ 439/676 X |
| 5,285,014 | 2/1994 | Gilchrist .......................... 439/135 X |
| 5,336,099 | 8/1994 | Aldous et al. . |
| 5,338,210 | 8/1994 | Beckham et al. . |

FOREIGN PATENT DOCUMENTS

| | | |
|---|---|---|
| 64-10585 | 7/1987 | Japan . |
| 1-96055 | 6/1989 | Japan . |
| 1-97652 | 6/1989 | Japan . |
| 1-243384 | 9/1989 | Japan . |
| 2-90481 | 3/1990 | Japan . |
| 2-162667 | 6/1990 | Japan . |
| 3-36477 | 4/1991 | Japan . |
| 3-262069 | 11/1991 | Japan . |
| 3-292519 | 12/1991 | Japan . |
| 4-10748 | 1/1992 | Japan . |
| 4-51761 | 2/1992 | Japan . |
| 52923 | 7/1992 | Japan . |
| 61658 | 8/1992 | Japan . |
| 61659 | 8/1992 | Japan . |

MINIATURE ELECTRICAL COMMUNICATIONS CONNECTORS

BACKGROUND

1. The Field of the Invention

This invention relates to electronic communication devices. More particularly, the present invention relates to connectors used to attach a communications line to a computer.

2. The Prior Art

Telecommunications services have become an integral part of modern society. The number of telephones in the United States alone exceeds 150 million. Moreover, communications within an organization between people and machines further increases the size of the communications network. The vast majority of the communications devices now in use require a wired connection to a communications line. Such communications devices include, for example, telephones, facsimile machines, modems, and local area network (LAN) adapters.

In order to conveniently attach a communications line to a communications device, standard connectors have been promulgated. The most popular of these connectors is known in the art as the RJ series of connectors. Of the RJ series of connectors, the RJ-11, RJ-12, and RJ-45 connectors are widely used. The RJ-11 connector comprises a six contact plug and a corresponding jack which is standardized world wide. The conventional six contact RJ-11 connector is both low cost and reliable.

The RJ-11 connector is commonly used to attach a communications device such as a telephone, facsimile machine, or a modem (all of which may be integrated into a single device) to a communications line. Such devices are becoming smaller, so small that one or more dimensions of the customary RJ-11 jack, also referred to as a receptacle, is larger than a corresponding dimension of communications device. For example, communication devices which comply with the Personal Computer Memory Card International Association (PCMCIA) standards have dimensions of about 2.1 inches by about 3.4 inches with a thickness of only 3.5 mm, 5 mm, or 8 mm. Such small communications devices cannot incorporate customary RJ series receptacles but still require compatibility with RJ series plugs in order to attach to a communications line.

U.S. Pat. No. 5,183,404 to Aldous provides several schemes for providing a miniature RJ-11 compatible receptacle. Disadvantageously, many of the schemes set forth in Aldous leave the electrical contacts exposed to the surrounding environment. Thus, a user may come in contact with the electrical contacts of the plug, which in the U.S. may carry more than 80 volts. Further, since the contacts of the RJ-11 plug are exposed, the contacts may be inadvertently shorted together. Thus, the scheme included in the Aldous reference presents a danger of electrical shock and electrical short circuit. Moreover, some of the receptacle schemes disclosed in the Aldous reference are particularly prone to breakage and damage because of inherently weak structures.

Thus, it would be an advance in the art to provide a miniaturized communications line connector which overcomes these drawbacks.

BRIEF SUMMARY AND OBJECTS OF THE INVENTION

In view of the above described state of the art, the present invention seeks to realize the following objects and advantages.

It is a primary object of the present invention to provide a communications line receptacle for use with a miniaturized communications device wherein the electrical contacts are shielded or isolated from the surrounding environment.

It is also an object of the present invention to provide a miniaturized communications line connector which is resistant to breakage and which can be moved out of the way when not being used.

It is a further object of the present invention to provide a miniaturized communications line receptacle which is readily replaceable if broken.

These and other objects and advantages of the invention will become more fully apparent from the description and claims which follow, or may be learned by the practice of the invention.

The present invention provides an apparatus for receiving an RJ series plug and making electrical connection with at least two conductors on the plug and conveying any signals on the conductors to a communications device such as a telephone, facsimile machine, modem, local area network adapter, or some other device.

The apparatus includes a body or a body means. A recess, or recess means, is provided on the body, the recess having an open first end and a closed second end, the recess having dimensions such that the plug is closely received therein. A means is also provided for releasably engaging the plug such that the plug is releasably held in the recess.

At least first and second electrical conductors are provided in the recess. Each of the electrical conductors are positioned such that they have electrical continuity with the electrical contacts in the plug when the plug is received into the recess. A means for conveying any electrical signal present on the electrical contacts to the communications device is also provided.

Also included is an expandable means for isolating the contacts in the plug from electrical continuity with an object in a surrounding environment such that passage of current from one or more of the electrical contacts to an object present in the surrounding environment is prevented. The expandable means is located at the second end of the recess and is preferably a stretchable membrane. The expandable means expands to accommodate a plug received in the recess and tends to return, and can be returned by a user, to a position within the thickness of the body when not being used so the apparatus assumes a compact configuration.

Embodiments of the present invention include receptacle modules which receive an RJ series plug. One preferred embodiment of the present invention includes a shell means for holding the body which receives the RJ series plug. The shell means can be easily installed in and removed from the communications device by the user. The shell means allows the body to be retracted into and extended from the communications device while still allowing easy removal and replacement of the shell and the body making up the receptacle module. Another preferred embodiment of the present invention includes means for pivotally rotating the body into and out of the communications device such that the body is substantially entirely within the communications device when not being used and the body is rotated to a position where the recess which receives the plug is accessible to the user when desired.

BRIEF DESCRIPTION OF THE DRAWINGS

In order to better appreciate how the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference designations.

Figure 1:
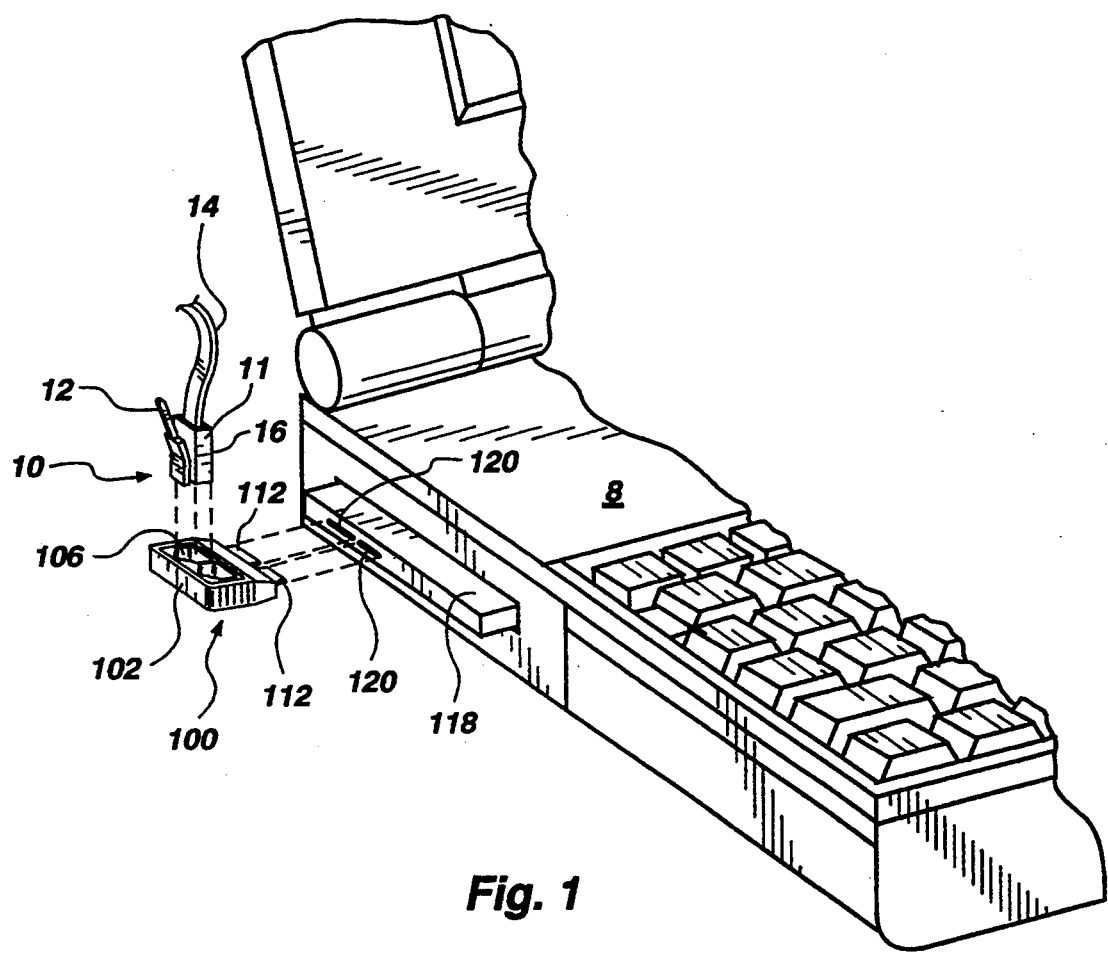
FIG. 1 is a partial perspective view of a lap top computer with a communications card partially inserted therein and a first embodiment of the present invention ready to be coupled to the communications card.

As is evident to those skilled in the art, advances in technology is allowing many different electrical devices to be made smaller than was contemplated just a few years ago. Represented in FIG. 1 is a partial perspective view of a lap top computer 8. In order to meet the demand for devices utilized with such lap top computers without adding any significant weight or bulk, devices such as a modem card 118 (shown partially withdrawn from the lap top computer 8) which complies with the PCMCIA standards have been produced. Significantly, while most lap top computers are generally note book size (about 8.5 inches by about 11 inches), the need for further miniaturization of devices such as the modem card 118 will increase as computing devices of all kinds continue to shrink.

The modem card 118 can also represent numerous other communication devices, for example, a local area network adaptor, voice mail device, or a facsimile device. Indeed, with the continuing trend of miniaturizing such devices, all of these devices may be combined into one card the size of the modem card 118 represented in FIG. 1. All of these devices are examples of those intended to come within the scope of the meaning of the term "communication devices" as used herein. Even further, other devices which require communication with one or more additional devices which are now available or which may become available in the future are intended to also come within the meaning of the term communication devices as used herein.

Figure 3:
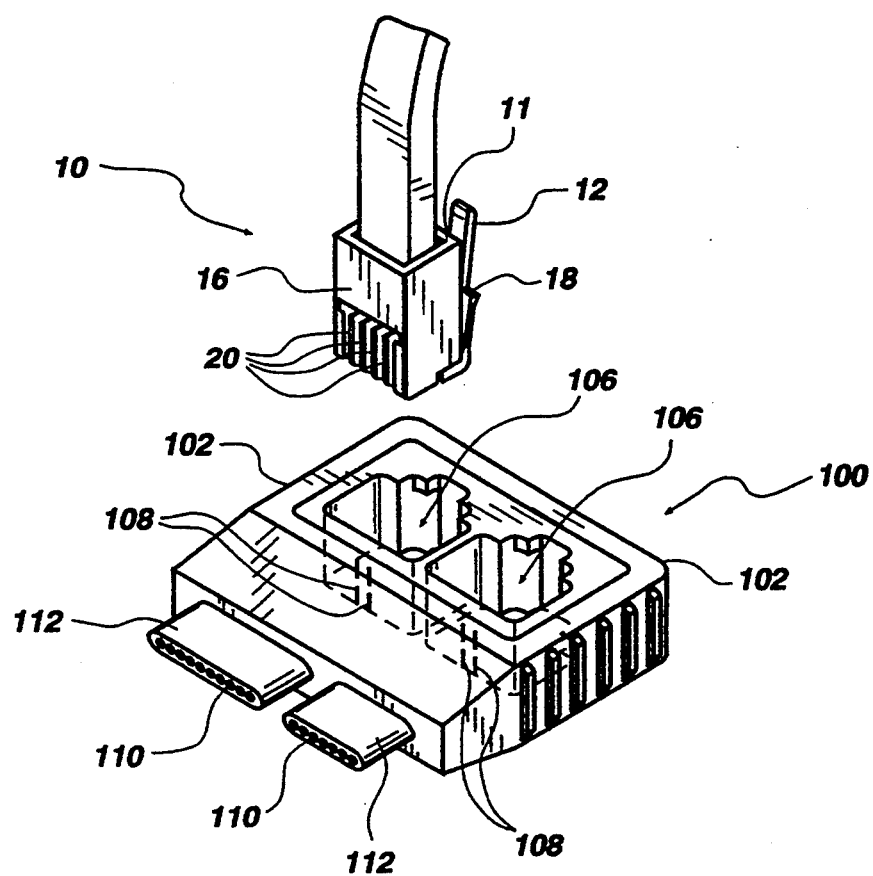
FIG. 3 is a reverse perspective view of the first embodiment of the present invention represented in FIG. 1.

A plug, which is compatible with the RJ series industry standard, is indicated generally at 10 in FIGS. 1 and 3. The RJ plug 10 includes a block 11 which has a first face 16 into which a plurality of electrical contacts 20 are recessed. The electrical contacts 20 are connected to wires (not represented) contained within a cable 14 which lead to the communications network, to another communications device, or other device. A biased clip 12, which is integrally molded as part of the block 11, is used to hold the plug in a corresponding receptacle.

Detailed information regarding the RJ series of connectors can be found in the publication found at Title 47 (Telecommunications), Code of Federal Regulations, Chapter I (Federal Communications Commission), Subchapter B (Common Carrier Services), Part 68 (Connection of Terminal Equipment to the Telephone Network), Subpart F (Connectors), Section 68.500 (1992) which is now incorporated herein by reference in its entirety.

Figure 2:
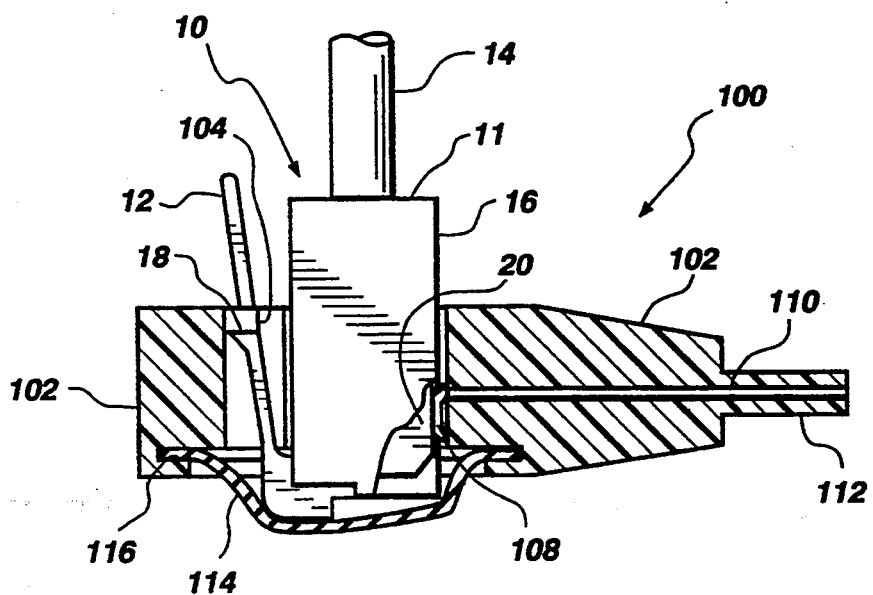
FIG. 2 is a cross sectional view of the first embodiment of the present invention represented in FIG. 1.

FIGS. 1–3 represent a first preferred arrangement of the present invention embodied in a receptacle module generally represented at 100. The receptacle module 100 includes a male coupling 112 which provides both physical and electrical connections to a corresponding female coupling 120 provided in the modem card 120.

The receptacle module 100 includes a body 102 which can preferably be fabricated from a plastic material using techniques known in the art. Two recesses, both of which are generally indicated at 106 in FIG. 3, are formed in the body 102. The inclusion of two recesses 106 desirably allows accommodation of two communication lines by the receptacle module 100.

A cross sectional view of one of the recesses 106 is provided in FIG. 2. FIG. 2 also shows the plug 10 inserted into the recess 106. The recess 106 has a first open end and a second closed end. When an RJ series plug is inserted into the recess 106, a plurality of conductors 108 communicates with one of its respective contacts 20. The conductors 108 can be spring-like so that they are in firm electrical continuity with the contacts 20. In some applications only two conductors 108 are provided while more than two conductors 108 are provided in other applications. Each of the conductors 108 is joined to a respective hollow pin, one of which is shown in cross section at 110, which mates with corresponding pins provided in the female coupling (120 in FIG. 1).

Still referring to FIG. 2, as the plug 10 is received into the recess, a ledge 104 provided on the biased clip 12 engages a ridge 18 formed on the body 102 and protrudes into the recess 106. The biased clip 12 and the ledge 104 cooperate to hold the plug 10 in the recess 106. When removal of the plug 10 is desired, the biased clip 12 is compressed and the plug 10 is removed from the recess 106.

Enclosing one end of the recess is an expandable member 114. In the embodiment of the invention represented in FIG. 2, the expandable member is an elastic and stretchable membrane. The expandable member 114 is preferably a rubber-like material which is an electrical insulator. The expandable member 114 is anchored in a groove 116 provided in the body 102 around the recess 106.

As clearly shown in the cross section of FIG. 2, when the plug 10 is fully inserted into the recess 106 the expandable member 114 is moved to expand the depth of the recess 106. The expandable member 114 isolates the contacts 20 from exposure to the surrounding environment. If the expandable member 114 were not included, as in the previously available schemes, the contacts 20 would be exposed to the surrounding environment and the possibility that the contacts 20 will be shorted together is present. It is also possible that the contacts 20 could be shorted to an electrical ground, pass a current to a user who touches the contacts 20, or some other event might occur which would damage the communications devices attached to the cable 14. As known in the art, voltages of more than 70 volts regularly are present on the contacts 20 when connected to the common carrier telephone network in the United States.

The illustrated expandable member 114 is preferably fabricated from a rubber-like material which is flexible enough to allow the end of the plug 10 to expand the flexible member 114 without undue force being exerted on the plug 10. The material from which the expandable member 114 is fabricated should be strong enough to allow long time use without any failure, e.g., tearing. Those skilled in the art will appreciate that the perimeter of the expandable member 114 should be securely anchored in the groove 116.

It is to be understood that structures other than the expandable member 114 can function as the expandable means for isolating the contacts 20 from electrical continuity with any object in the surrounding environment. For example, a combination of rigid panels joined together to allow expansion can function as the expandable means. Further, a combination of rigid elements and elastic elements, or one or more rigid elements which fold within the thickness of the body 102, can be devised using the information contained herein. It is preferred that the thickness of the body 102 be not greater than the thickness of the modem card 118. Thus, the expandable member 114 should tend to automatically return to within the plane of the body 102 once the plug 10 is removed and/or allow the user to collapse the expandable member 114.

Referring to FIG. 3, it is preferred that the recesses 106 have particular dimensions. It is preferred that the two unbroken side walls of the recess each have a length in the range from about 0.265 inches to about 0.285 inches and the single remaining straight wall, which is perpendicular to the two side walls, have a dimension in the range from about 0.45 inches to about 0.475 inches for compatibility with RJ-45 plugs. It is also preferred that the two unbroken side walls of the recess have a length in the range from about 0.265 inches to about 0.285 inches and the single remaining straight wall, which is perpendicular to the two side walls, have a dimension in the range from about 0.375 inches to about 0.4 inches for compatibility with RJ-11 and RJ-12 plugs.

Figure 4:
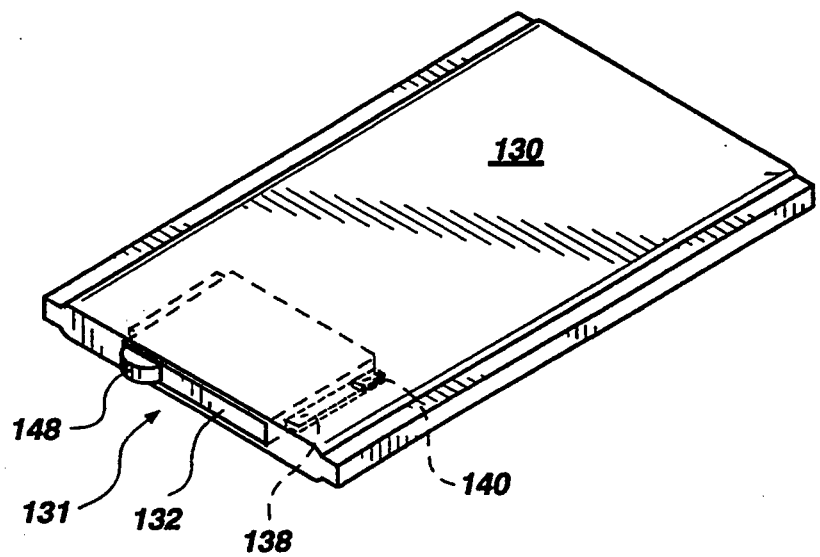
FIG. 4 is a perspective view of a second embodiment of the present invention with a receptacle module illustrated in a retracted position.

FIG. 4 is a perspective view of a second embodiment of the present invention with a receptacle module, generally represented at 131. The receptacle module 131 is illustrated in FIG. 4 as being retracted into a communications card 130. The communications card 130 can house any of the communications devices indicated earlier.

The receptacle module 131 includes a body 132 and a finger pull 148 formed thereon. The receptacle module 131 is conveniently kept in its retracted position illustrated in FIG. 4 until the communications card 130 needs to be connected to a communications line (not shown in FIG. 4). When needed, the user grasps the finger pull 148 and pulls the receptacle module 131 to its extended position represented in FIG. 5.

Figure 5:
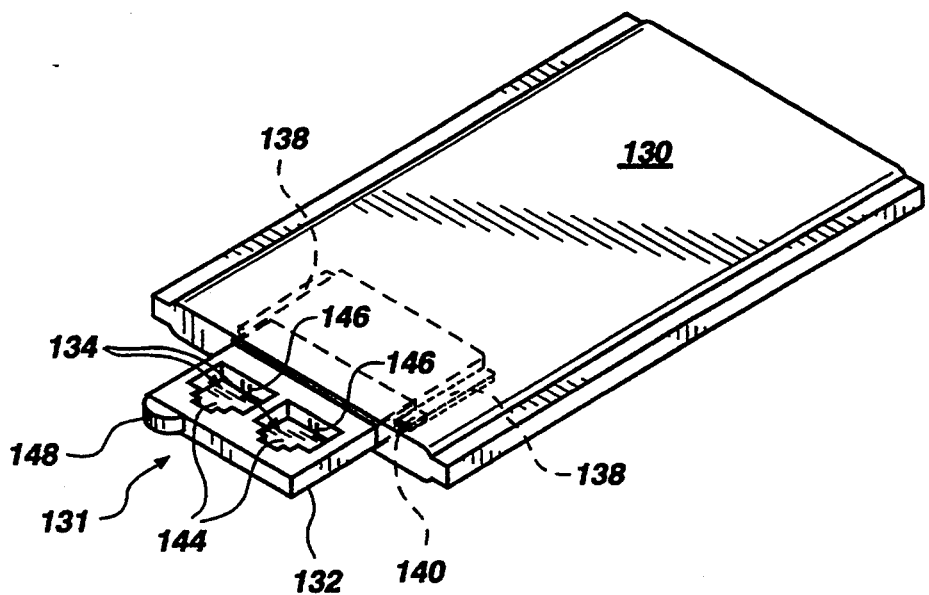
FIG. 5 is a perspective view of the second embodiment of the present invention represented in FIG. 4 illustrated in an extended position.

FIG. 5 illustrates the receptacle modules in its extended position. The receptacle module 131 includes a pair of ridges (one shown in phantom image at 140 in FIGS. 4 and 5) which extend from the sides of the receptacle module 131 and which slide along a pair of grooves, shown best in phantom image in FIG. 5 at 138.

The receptacle module 131 includes two recesses, each generally indicated at 134, with each recess including a plurality of conductors 146. Each recess 134 also preferably includes an expandable member 144 which can be identical, similar, or equivalent to the expandable member 114 discussed in connection with FIGS. 1-3.

Figure 6:
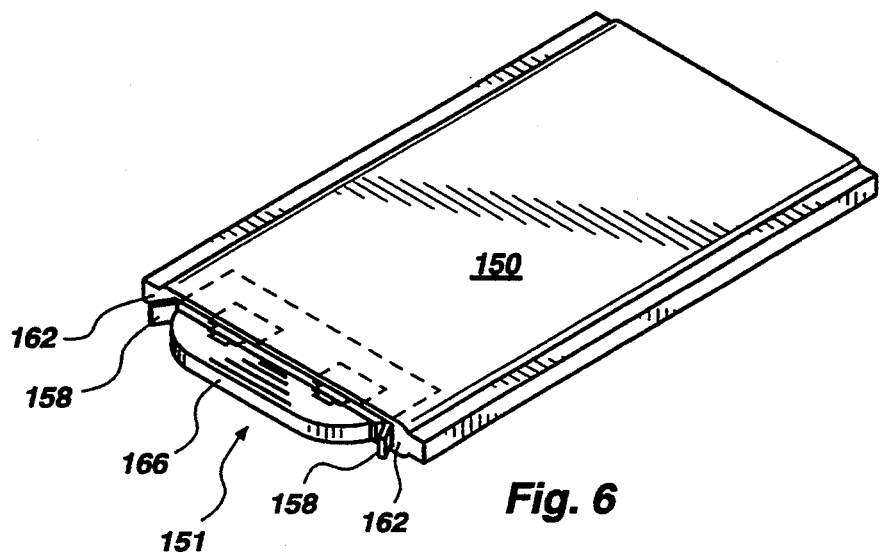
FIG. 6 is a perspective view of a third embodiment of the present invention with a removable receptacle module illustrated in a retracted position.
Figure 7:
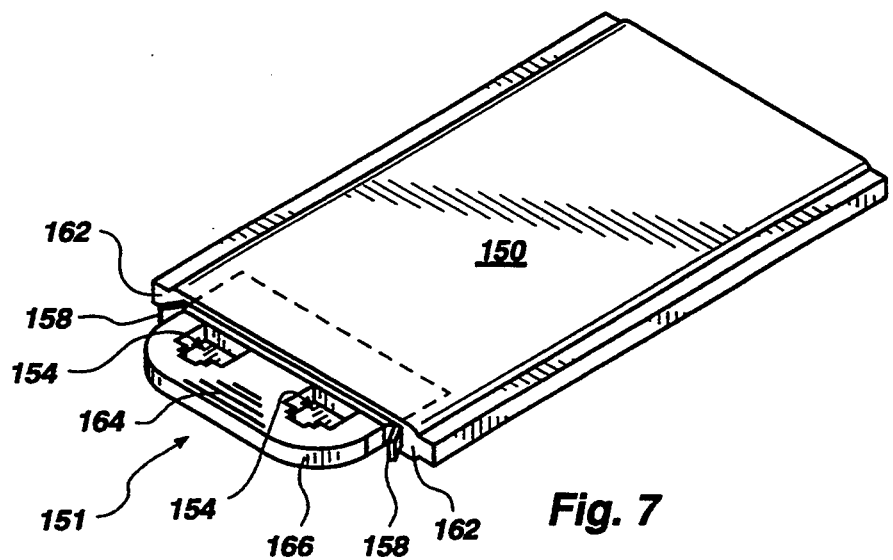
FIG. 7 is a perspective view of the third embodiment of the present invention represented in FIG. 6 with the removable receptacle module illustrated in an extended position.

FIG. 6 is a perspective view of a third embodiment of the present invention including a removable receptacle module generally represented at 151. The removable receptacle module 151 is shown in place in a communications card 150 as has been explained earlier. The removable receptacle module includes a body 166 which is illustrated in FIG. 6 in a retracted position. It will be appreciated that the retracted position illustrated in FIG. 6 can be used or the body 166 can be fully withdrawn into the communications card 150 housing. In order to use the apparatus, a user preferably grasps finger grips 166 and pulls the body 166 out to an extended position as represented in FIG. 7.

The removable receptacle module 151 is advantageously easily removable from the communications card 150. In order to remove the entire removable receptacle module 151 from the communications card 150, a pair of wings 158 are squeezed inwardly so a ledge (158 in FIG. 8) provided on each wing 158 disengages from an edge 162 of the communications card 150 housing. The entire removable receptacle module 151 can then be removed from the communications card 150. It will be appreciated that other structures can carry out the function of the wings 158.

It is common for a receptacle module to be broken or damaged during use. If a receptacle module, or other structure providing connection to a communications line is permanently affixed to the communications card or its equivalent, then the only economical recourse is replacement of the entire communications card, even though only the receptacle module has been damaged. The embodiment of the present invention represented in FIGS. 6-9 provides that the receptacle module can be easily replaced in case of damage.

Moreover, the removable receptacle module 151 can be replaced with another removable receptacle module which is adapted to receive another size or style of plug (not represented in FIGS. 6–9). For example, the RJ-11, RJ-12, and RJ-45 connectors have all been generally adopted for specialized applications. Thus, a removable receptacle module adapted for use with RJ-11 plugs can be easily replaced with a removable receptacle module adapted for use with RJ-45 plugs and so forth.

Figures 8, 9:
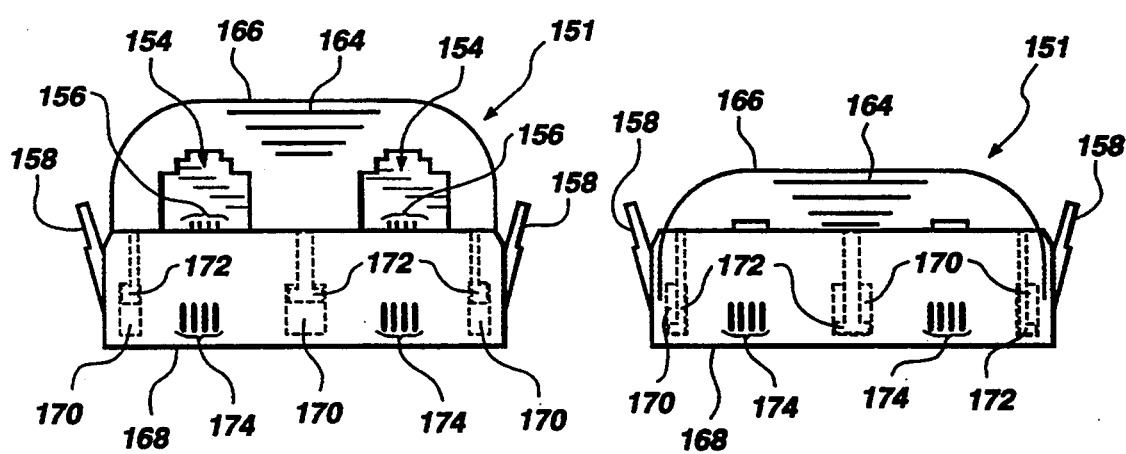
FIG. 8 is a top plan view of the removable receptacle module represented in FIG. 7.
FIG. 9 is a top plan view of the removable receptacle module represented in FIG. 6.

FIGS. 8 and 9 provide detailed views of the removable receptacle module 151 with the body 166 in an extended and retracted position, respectively. Provided in the body 166 are a pair of recesses, generally indicated at 154, and a plurality of conductors 156. Each recess 154 preferably includes an expandable member, generally indicated at 154, as has been previously explained.

As represented in FIGS. 8 and 9, the removable receptacle module 151 includes a shell 168 from which the wings 156 extend and in which the body 166 slides. It will be appreciated that many different structures can be devised by those skilled in the art to carry out the functions of the shell using the teachings contained herein. Attached to the body 166 are three guides 172 which slide within three respective grooves 170. The guides 172 and the grooves 172 are configured so that the body 168 is held captive in, i.e., cannot be completely removed from, the shell 168. Also represented in FIGS. 8 and 9 are a plurality of electrical conductors indicated at brackets 174 which mate with suitable structures within the communications card 150 housing to allow transfer of signals between the communications line (not illustrated in FIGS. 8 and 9) and the communications card (150 in FIGS. 6 and 7).

It will be appreciated that since the housing 168 of the receptacle module 151 is retained within the communications card 151, and that the communications card 150 is held within a lap top computer or a cabinet of some kind, the shell 168 is protected from breakage and damage so it can be removed without undue difficulty even if damage does occur to other components of the removable receptacle module 151.

Figure 10:
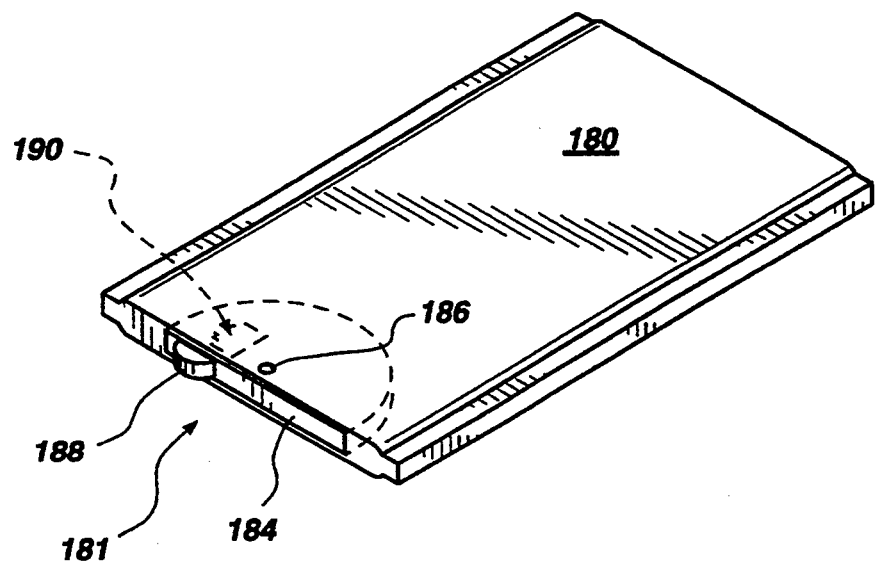
FIG. 10 is a perspective view of a fourth embodiment of the present invention with the receptacle module illustrated in a retracted position.

FIG. 10 provides a perspective view of a fourth embodiment of the present invention. The embodiment illustrated in FIG. 10 includes a receptacle module, generally indicated at 181, illustrated in a retracted position. The receptacle module 181 includes a body 184 which is preferably semicircular in shape and rests, when in its retracted position, within a cavity in a communications card 180, the cavity being generally indicated at 182 in FIG. 11. The cavity 182 is preferably semicircular in shape but can be any shape which provides sufficient room to accommodate the body 184 in its retracted position.

Figure 11:
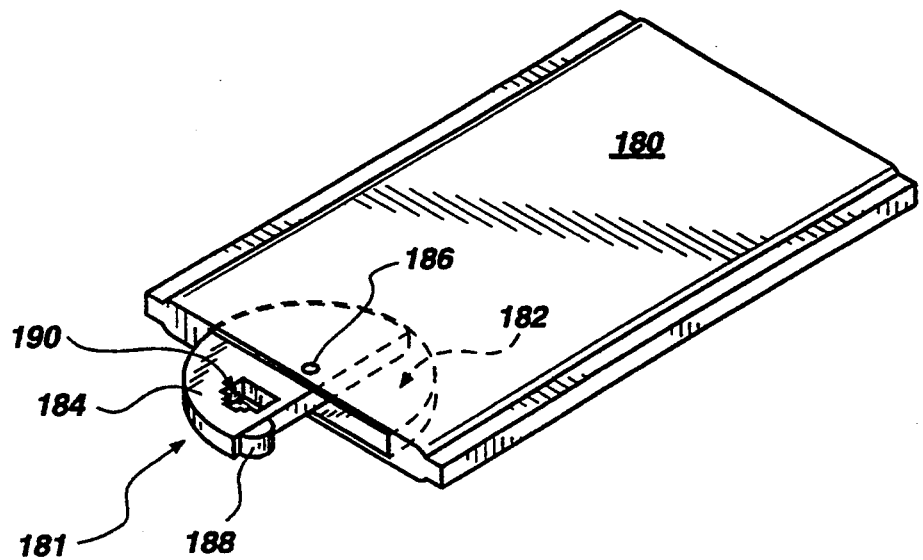
FIG. 11 is a perspective view of the fourth embodiment of the present invention represented in FIG. 10 with the receptacle module, illustrated in an extended position.

The body 184 is attached to the communications card 180 housing by way of a pivot 186. The pivot 186 allows the body 184 to be rotated by pulling on a finger grip 188 to an extended position as illustrated in FIG. 11. In its extended position, the receptacle module 181 allows access to a recess 190 which is preferably configured as explained earlier and is ready to receive a plug, such as plug 10 in FIG. 1. Electrical connections between the conductors (not illustrated) disposed in the recess 190 and the circuitry contained in the communications card 190 are provided as can be designed by those skilled in the art. Those skilled in the art can also arrive at numerous structures which are equivalent to those illustrated in FIGS. 10 and 11 using the teachings contained herein.

Figure 12:
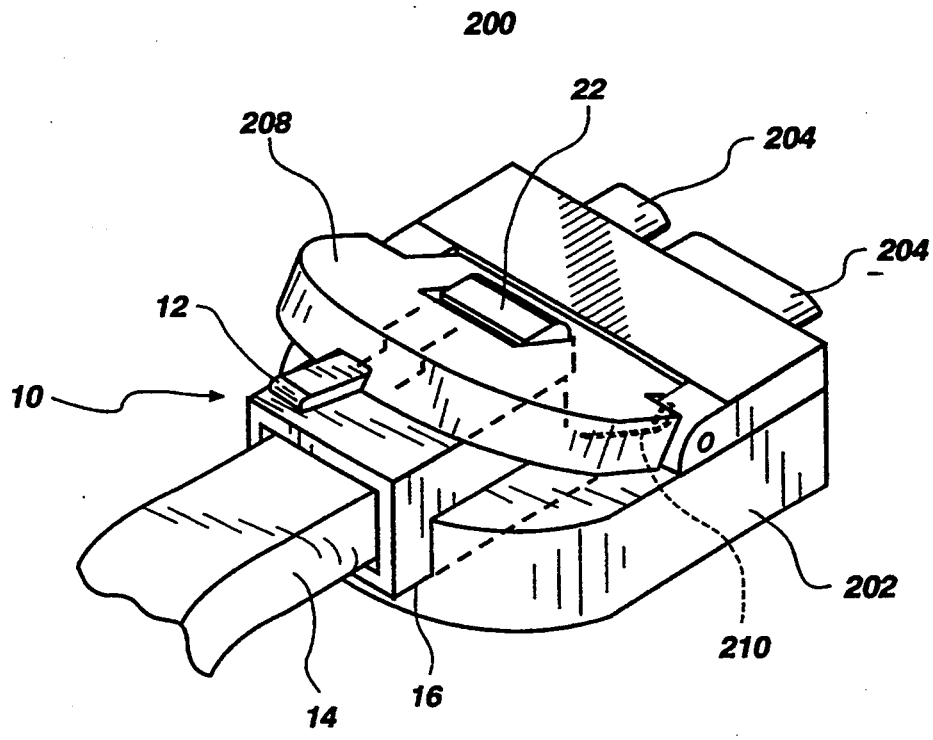
FIG. 12 is a perspective view of a fifth embodiment of the present invention.
Figure 13:
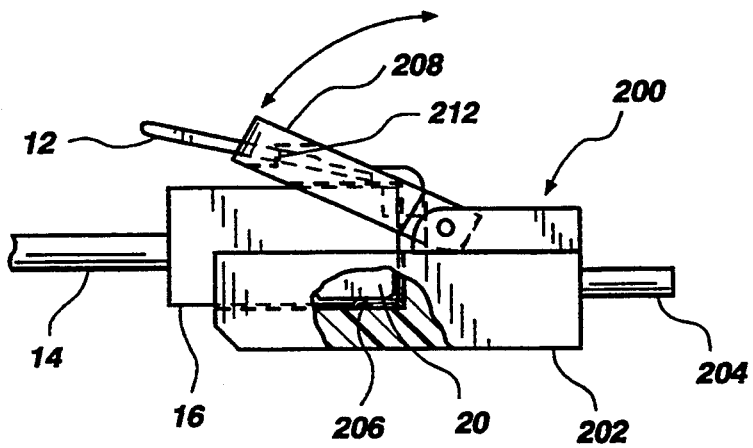
FIG. 13 is a side elevational view of the fifth embodiment of the present invention represented in FIG. 12.

FIG. 12 provides a perspective view of a fifth embodiment of the present invention which includes a receptacle module, generally indicated at 200, with male couplings 204 similar to those represented in FIGS. 1–3 at 112 and which are received by a communications card such as those described earlier. A body 202 is provided with a recess into which the plug 10 is inserted. As illustrated best in the cross sectional view of FIG. 13, a plurality of conductors 206 are provided which communicate with respective contacts 20 on the plug 10.

With the plug 10 in position on the body 202, a lever 208 holds the plug 10 in place. The lever 208 is biased toward the body 202 by a spring 210. A ledge 212 provided on the lever 208 engages the ridge (18 in FIGS. 2 and 3) provided on the clip 12 to further hold the plug in place. An aperture is provided on the lever 208 to accommodate a hump 22 which is provided on plugs which comply with the RJ series standards. It will be appreciated that the biased lever provides a much more secure and convenient to use apparatus than any of those available in the art which are suitable for use with RJ series plugs and which is suitable for use with miniaturized devices such as the previously described communications cards.

In view of the foregoing, it will be appreciated that the present invention provides a communications line receptacle for use with a miniaturized communications device wherein the electrical contacts are shielded from the surrounding environment and which is resistant to breakage and which can be moved out of the way when not being used. The present invention also provides a miniaturized communications line receptacle which is replaceable if broken.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An apparatus for receiving an RJ series plug having a biased clip and for making electrical connection with at least first and second electrical contacts provided on the plug and conveying any signals on the first and second electrical contacts to a communications device, the apparatus comprising:
   body means, the body means having a thickness;
   recess means provided in the body, the recess means having an open first end and a closed second end, the recess means having dimensions such that the plug is closely received therein;
   means for releasably engaging the biased clip such that the plug is releasably held in the recess means;
   a first electrical conductor provided in the recess means, the first electrical conductor being positioned such that it makes electrical continuity with the first electrical contact in the plug when the plug is received by the recess means and when the means for releasably engaging the biased clip engages the biased clip;

a second electrical conductor provided in the recess means, the second electrical conductor being positioned such that it makes electrical continuity with the first electrical contact in the plug when the plug is received by the recess means and when the means for releasably engaging the biased clip engages the biased clip;

means for conveying any electrical signal present on the first and second electrical contacts to the communications device; and expandable means, located at the second end of the recess means, for isolating the first and second electrical contacts from electrical contact with an object in a surrounding environment such that passage of current from one or more of the first and second electrical contacts to an object present in the surrounding environment is prevented, the expandable means having a first position within the thickness of the body and a second expanded position which is outside the thickness of the body, the expandable means being movable to, and tending to return to, the first position when the plug is removed from the recess means.

2. An apparatus as defined in claim 1 wherein the means for isolating comprises an expandable and stretchable membrane anchored at the second end of the recess means.

3. An apparatus as defined in claim 1 wherein the body means comprises a first side and a second side and wherein the recess means comprises a rectangular recess having three walls, the walls being oriented substantially perpendicularly to the first side.

4. An apparatus as defined in claim 3 wherein the four walls comprise a first pair of parallel opposing walls each having a length about equal to 0.26 inches and the third wall has a length about equal to 0.46 inches.

5. An apparatus as defined in claim 3 wherein the four walls comprise a first pair of parallel opposing walls each having a length about equal to 0.26 inches and the third wall has a length about equal to 0.38 inches.

6. An apparatus as defined in claim 1 wherein the means for releasably engaging the biased clip comprises a ridge provided on a side of the recess means.

7. An apparatus for receiving an RJ series plug having a biased clip and for making electrical connection with at least first and second electrical contacts provided on the plug, the apparatus comprising:

a communications device, the communications device having a first side with a dimension which is not substantially greater than 8 mm;

body means;

shell means for holding the body;

means for removably holding the shell means substantially within the communications device such that the shell means and the body can be removed from and inserted into the communications device as a unitary module;

means for sliding the body into and out of the shell means;

means for pulling the body from the shell means by a human digit when the body is slid into the shell means, the means for pulling protruding beyond the first side of the communications device when the body is fully slid into the communications device;

recess means provided in the body means, the recess means having an open first end and a closed second end, the recess means having dimensions such that the plug is closely received therein;

means for releasably engaging the biased clip such that the plug is releasably held in the recess means;

a first electrical conductor provided in the recess means, the first electrical conductor being positioned such that it makes electrical continuity with the first electrical contact in the plug when the plug is received by the recess means and when the means for releasably engaging the biased clip engages the biased clip;

a second electrical conductor provided in the recess means, the second electrical conductor being positioned such that it makes electrical continuity with the first electrical contact in the plug when the plug is received by the recess means and when the means for releasably engaging the biased clip engages the biased clip; and means for conveying any electrical signal present on the first and second electrical contacts to the communications device; and an expandable member located at the second end of the recess means, the expandable member isolating the first and second electrical conductors from electrical continuity with an object in the surrounding environment such that passage of current from one or more of the first and second electrical conductors to an object present in the surrounding environment is prevented.

8. An apparatus as defined in claim 7 wherein the expandable member comprises an expandable and stretchable membrane anchored at the second end of the recess means.

9. An apparatus as defined in claim 7 wherein the body comprises a thickness and wherein the expandable member has a first position within the thickness of the body and a second expanded position which is outside the thickness of the body, the expandable member being biased to return to the first position.

10. An apparatus as defined in claim 7 wherein the body means comprises a first side and a second side and wherein the recess comprises a rectangular recess having three walls, the walls being oriented substantially perpendicularly to the first side.

11. An apparatus as defined in claim 11 wherein the four walls comprise a first pair of parallel opposing walls each having a length in the range from about 0.265 inches to about 0.285 inches and the third wall has a length in the range from about 0.45 inches to about 0.475 inches.

12. An apparatus as defined in claim 10 wherein the four walls comprise a first pair of parallel opposing walls each having a length in the range from about 0.265 inches to about 0.285 inches and the third wall has a length in the range from about 0.375 inches to about 0.4 inches.

13. An apparatus as defined in claim 7 wherein the means for releasably engaging the biased clip comprises a ridge provided on the side of the recess.

14. An apparatus as defined in claim 7 wherein the shell means comprises a shell having a plurality of grooves and wherein the body means further comprises guides sliding within the grooves.

15. An apparatus for receiving an RJ series plug having a biased clip and for making electrical connection with at least first and second electrical contacts provided on the plug, the apparatus comprising:

a communications device, the communications device having a first side with a dimension which is not substantially greater than 8 mm;

a body, the body having a first half and a second half;

a recess in the body, the recess having an open first end and a closed second end, the recess having dimensions such that the plug is closely received therein;

means for pivotally rotating the body into and out of the first side of the communications device such that both the first half and the second half of the body are substantially entirely within the communications device when in a first position and at least the first half of the body being entirely within the communications device when the body is in a second position, the recess in the body being accessible when the body is in the second position;

means for pulling the body from the communications device by a human finger when the body is in the first position and rotated into the communications device, the means for pulling protruding beyond the first side of the communications device when the body is in the first position;

means for releasably engaging the biased clip such that the plug is releasably held in the recess;

a first electrical conductor provided in the recess, the first electrical conductor being positioned such that it makes electrical continuity with the first electrical contact in the plug when the plug is received by the recess and when the means for releasably engaging the biased clip engages the biased clip;

a second electrical conductor provided in the recess, the second electrical conductor being positioned such that it makes electrical continuity with the first electrical contact in the plug when the plug is received by the recess and when the means for releasably engaging the biased clip engages the biased clip; and means for conveying any electrical signal present on the first and second electrical contacts to the communications device.

16. An apparatus as defined in claim 15 further comprising an expandable member located at the second end of the recess, the expandable member isolating the first and second electrical contacts from electrical continuity with an object in the surrounding environment such that passage of current from one or more of the first and second electrical contacts to an object present in the surrounding environment is prevented.

17. An apparatus as defined in claim 16 wherein the expandable membrane comprises a stretchable membrane anchored at the second end of the recess.

18. An apparatus as defined in claim 15 wherein the body comprises a first side and a second side and wherein the recess comprises a rectangular recess having three walls, the walls being oriented substantially perpendicularly to the first side.

19. An apparatus for holding an RJ series plug having a biased clip, first and second electrical contacts located on a first face having a width and a length, the apparatus further for making electrical connection with at least first and second electrical contacts provided on the plug, the apparatus comprising:

a body;

a recess in the body, the recess having a first opening, an adjacent second opening, a first wall, a second wall adjacent and perpendicular to the first wall, and a third wall adjacent and perpendicular to the second wall, the second wall having a dimension slightly larger than the width of the first wall such that the plug is closely received therein;

a member pivotally attached to the body such that the member pivots from a first position substantially over the recess to a second position substantially no more than forty-five degrees from the first position;

means for biasing the member toward the recess such that the member can be moved to the second position and the first face of the plug placed in the recess facing away from the member and the member engages the biased clip and is biased to hold the first face of the plug in the recess;

a first electrical conductor provided in the recess, the first electrical conductor being positioned such that it makes electrical continuity with the first electrical contact in the plug when the plug is received by the recess and when the means for releasably engaging the biased clip engages the biased clip;

a second electrical conductor provided in the recess, the second electrical conductor being positioned such that it makes electrical continuity with the first electrical contact in the plug when the plug is received by the recess and when the means for releasably engaging the biased clip engages the biased clip; and means for conveying any electrical signal present on the first and second electrical contacts to the communications device.

* * * * *

UNITED STATES PATENT AND TRADEMARK OFFICE
CERTIFICATE OF CORRECTION

PATENT NO. : 5,411,405
DATED : May 2, 1995
INVENTOR(S) : Steve R. McDaniels; Paul H. Glad; David Naegle; and Jon R. Hinton It is certified that error appears in the above-identified patent and that said Letters Patent is hereby corrected as shown below:

On the cover page at the Inventors section, the language "John R. Hinto" is corrected to -- John R. Hinton --.

column 4, line 46 the language "modem card 120" is corrected to -- modem card 118 --.

Column 6, line 22 the language "modules" is corrected to -- module --.
Column 6, line 46, the language "grips 166" is corrected to -- grips 164 --.

Column 7, line 20 the reference numeral "156" is corrected to -- 158 --.
Column 7, line 26, the language "grooves 172" is corrected to -- grooves 170 --.
Column 7, line 65, the "." is deleted.

Claim 1 at column 9, line 4 the language "first" is corrected to -- second --.

Claim 4 at column 9, line 33 the language "four" is corrected to -- three --.

Claim 5 at column 9, line 37 the language "four" is corrected to -- three --.

Claim 7 at column 10, line 15 the language "first" is corrected to -- second --.
Claim 7 at column 10, line 18, the language "and" is deleted.

UNITED STATES PATENT AND TRADEMARK OFFICE
CERTIFICATE OF CORRECTION

PATENT NO. : 5,411,405
DATED : May 2, 1995
INVENTOR(S) : Steve R. McDaniels; Paul H. Glad; David Naegle; and Jon R. Hinton It is certified that error appears in the above-identified patent and that said Letters Patent is hereby corrected as shown below:

Claim 11 at column 10, line 45 the language "claim 11" is corrected to -- claim 10 --.

Claim 15 at column 11, line 35 the language "first" is corrected to -- second --.

Claim 19 at column 12, line 42 the language "first" is corrected to -- second --.

Signed and Sealed this

Twenty-ninth Day of May, 2001

*Attest:*

NICHOLAS P. GODICI

*Attesting Officer*    Acting Director of the United States Patent and Trademark Office